(12) United States Patent
Jones

(10) Patent No.: US 6,724,273 B1
(45) Date of Patent: Apr. 20, 2004

(54) FILTER CIRCUITRY FOR VOLTAGE CONTROLLED OSCILLATOR

(75) Inventor: Mark Alan Jones, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 102 days.

(21) Appl. No.: 10/015,119

(22) Filed: Oct. 26, 2001

(51) Int. Cl.[7] .................................................. H03B 1/00
(52) U.S. Cl. .............................. 331/177 V; 331/117 R; 331/117 FE; 331/36 C; 331/175
(58) Field of Search .................. 331/177 V, 117 R, 331/117 FE, 36 C, 175

(56) References Cited

U.S. PATENT DOCUMENTS 6,469,587 B2 * 10/2002 Scoggins ................ 331/117 R

OTHER PUBLICATIONS

Bram De Muer et al., A 1.8 GHz highly–tunable low–phase–noise CMOS VCO, IEEE 2000 Custom Integrated Circuits Conference, pp. 585–588, May 2000.

* cited by examiner

*Primary Examiner*—Arnold Kinkead
(74) *Attorney, Agent, or Firm*—Vedder, Price, Kaufman & Kammholz, P.C.

(57) ABSTRACT

The controlling circuit element of a voltage controlled oscillator (VCO) for use in a phase lock loop (PLL) is a varactor connected between the terminals used to convey the power supply voltage and the frequency control voltage. The loop filter, implemented in a shunt configuration at the input of the VCO, is also connected between the power supply and frequency control voltage terminals. As a result, any variations in the power supply voltage appear at both terminals of the varactor due to the voltage coupling effect of the loop filter between the shared power supply and frequency control voltage terminals.

18 Claims, 6 Drawing Sheets

FILTER CIRCUITRY FOR VOLTAGE CONTROLLED OSCILLATOR

BACKGROUND OF THE INVENTION

1. Field of the Invention

The present invention relates to voltage controlled oscillators (VCOs), such as those used in phase lock loops (PLLs), and in particular, to filter circuits used to filter control voltages for controlling voltage controlled capacitances in VCOs.

2. Description of the Related Art

All radio transceiver systems require the use of one, though usually more, internal signal source, such as an oscillator, for generating the one or more internal signals needed for frequency converting, modulating or demodulating outgoing and incoming communication signals. More often than not, particularly in modern radio transceivers, such internal signal sources are implemented as frequency synthesizers using PLL circuits. As is well known in the art, PLL circuits generally include an oscillator circuit that generates the desired output signal. This output signal is fed back and compared to some form of internal reference signal, such as that generated by a crystal controlled oscillator. This comparison process can be in the form of a phase or frequency comparison of the two signals. As a result of this comparison, a control signal is generated and filtered for controlling the oscillator that provides the actual output signal. Most PLL circuits are digital PLL circuits, which means that this control signal requires significant filtering prior to its use in controlling the oscillator.

Performance requirements of modern radio transceiver systems continue to become increasingly stringent. As a result, phase noise and frequency stability performance characteristics of the PLL circuit become increasingly significant in determining the overall performance of the transceiver system. Generally, it is the VCO that is primarily responsible for determining, and often limiting, these performance criteria. In modern systems, this problem is made worse by the fact that it is generally necessary to implement the VCO within a monolithic integrated circuit (IC) to achieve low power consumption and low cost for transceivers such as those used in cellular telephones and other forms of wireless data appliance systems.

Particularly within the environment of an IC, the design of the integrated VCO often presents many challenges due to many different and conflicting performance criteria, such as phase noise, output frequency range, input tuning voltage range, output signal power and output signal frequency changes due to either load variations or power supply variations. When load variations cause the output signal frequency to change, it is considered to be "pulled" with respect to its desired value, whereas when power supply variations cause the output signal frequency to change, it is considered to be "pushed" with respect to its desired value.

Further complicating the problems of implementing an integrated VCO is the fact that implementations of passive components in an IC are significantly limited in terms of their quality and performance tolerances. Hence, the ability of a designer to isolate an integrated VCO from frequency "pulling" or "pushing" effects is limited by the quality of passive components available in an IC as are typically needed for implementing appropriate filter circuits.

Accordingly, it would be desirable to have a filter circuit that, when used to filter a control voltage for controlling a VCO, particularly within a monolithic IC environment, is substantially unaffected by the typical limitations associated with the passive components available in such an IC environment.

SUMMARY OF THE INVENTION

In accordance with the present invention, the controlling circuit element of a voltage controlled oscillator (VCO) for use in a phase lock loop (PLL) is a voltage controlled capacitance (varactor) connected between the terminals used to convey the power supply voltage and the frequency control voltage. The loop filter, implemented in a shunt configuration at the input of the VCO, is also connected between the power supply and frequency control voltage terminals. As a result, any variations in the power supply voltage appear at both terminals of the varactor due to the voltage coupling effect of the loop filter between the shared power supply and frequency control voltage terminals.

In accordance with one embodiment of the present invention, a filter circuit for filtering a control voltage used to control varactor circuitry in a VCO includes a power supply terminal, a control terminal and shunt filter circuitry. The power supply terminal conveys a power supply voltage having a magnitude and polarity relative to a reference potential. The control terminal conveys a control voltage for varactor circuitry, wherein, relative to the reference potential, the control voltage has a polarity equal to the power supply voltage polarity and a magnitude less than or equal to the power supply voltage magnitude. The shunt filter circuitry, connected between the power supply and control terminals, filters the control voltage.

In accordance with another embodiment of the present invention, also included is varactor circuitry, connected between the power supply and control terminals, that in response to the control voltage exhibits a voltage controlled capacitance. Such varactor circuitry can include circuit elements such as a diode or an insulated gate field effect transistor.

In accordance with still another embodiment of the present invention, also included is a reference terminal that establishes the reference potential, and VCO circuitry, connected between the power supply, reference and control terminals, that in response to the control voltage generates a voltage controlled oscillation signal. Such oscillator circuitry can include bias and resonant circuitry. The bias circuitry, connected between the power supply and reference terminals, in response to the power supply voltage, generates a bias signal. The resonant circuitry, connected between selected ones of the power supply terminal, reference terminal, control terminal and bias circuitry, in response to the bias signal and control voltage generates the voltage controlled oscillation signal. The resonant circuitry can include varactor circuitry, connected between the power supply and control terminals, that in response to the control voltage exhibits a voltage controlled capacitance. Such varactor circuitry can include circuit elements such as a diode or an insulated gate field effect transistor.

DETAILED DESCRIPTION OF THE INVENTION

Figure 1:
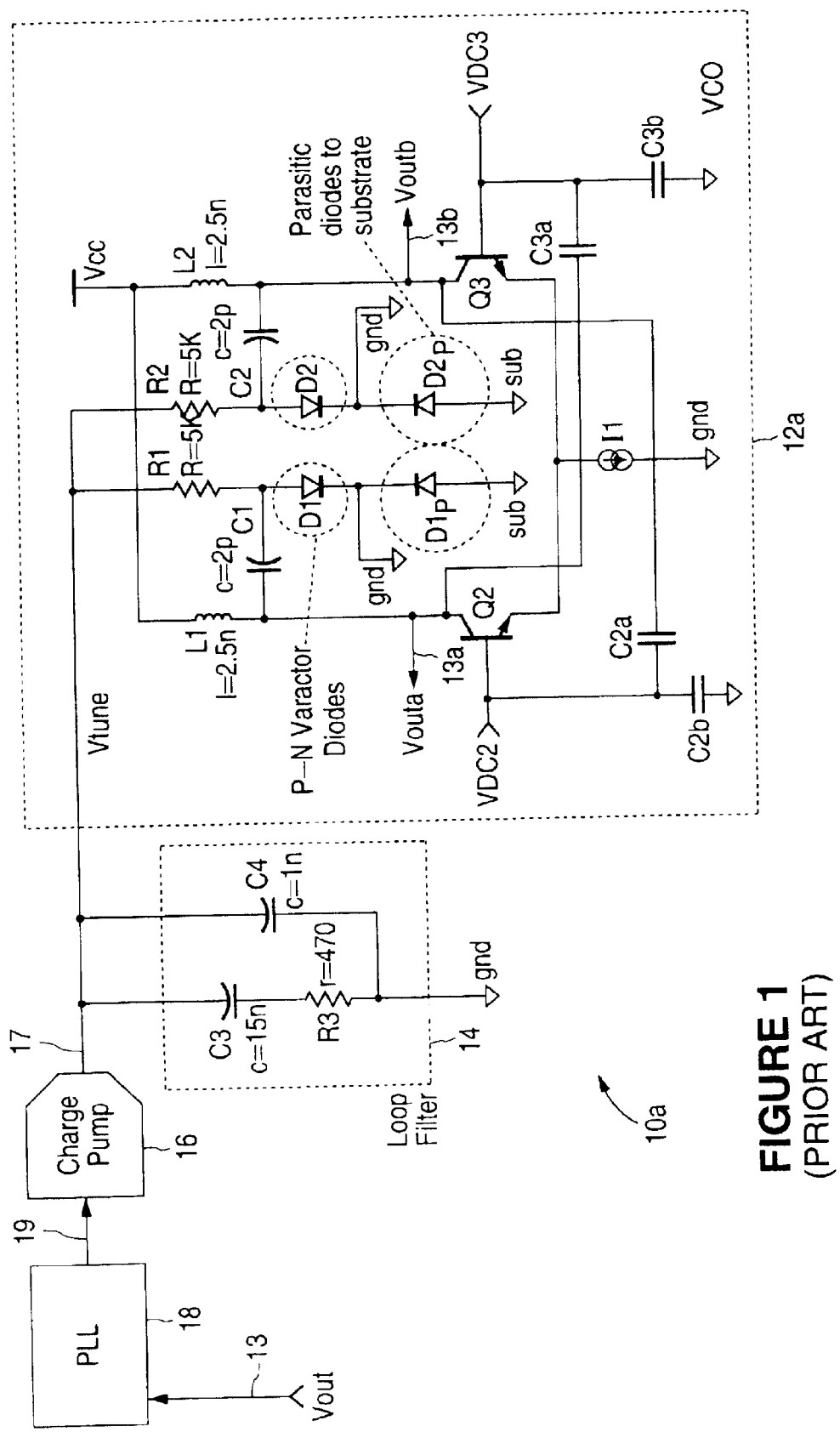
FIG. 1 is a schematic diagram of a frequency synthesizer using a conventional VCO and loop filter circuit with a PLL.

Referring to FIG. 1, a conventional frequency synthesizer 10a includes a VCO 12a, loop filter 14, charge pump 16 and PLL circuit 18, interconnected substantially as shown. In accordance with conventional techniques, the VCO 12a generates an output signal Vout 13 which is fed back to the PLL 18. By comparing the frequency or phase of this signal 13 to a reference signal (not shown) the PLL 18 generates a comparison signal 19 that indicates whether the frequency of the VCO signal Vout must be increased or decreased so as to be considered "locked" with the reference signal in terms of phase or frequency. This comparison signal 19 controls a conventional charge pump circuit 16 which, in turn, sources current to or sinks current from its output terminal 17, thereby generating, in cooperation with the loop filter 14, a control, or tuning, voltage Vtune.

The loop filter 14 is a shunt filter configuration, meaning that it is not connected in series with the control voltage Vtune, but is connected between the control voltage Vtune terminal 17 and another circuit node, generally the circuit reference, or ground GND, terminal. Typically the loop filter 14 is a low pass filter and is often implemented as a resistor R3 connected in series with a capacitor C3, both of which are shunted by another capacitor C4, as shown.

The control voltage Vtune is used to control dual voltage variable capacitances (varactors) implemented as dual diodes D1, D2. The capacitances of these diodes D1, D2 interact with the inductances of two inductors L1, L2, connected via coupling capacitors C1, C2, to create a resonant circuit which generates the output oscillator signal Vout 13. In this circuit implementation, the output signal Vout 13 is in the form of a differential output signal having two output signal phases Vouta 13a, Voutb 13b which appear at the collector terminals of two transistors Q2, Q3 interconnected as a differential amplifier with a tail current source I1. Positive feedback between these transistors Q2, Q3 is provided by capacitive voltage divider circuits C2a/C2b, C3a/C3b interconnecting their respective base and collector terminals. These transistors Q2, Q3, in accordance with well known biasing techniques, are biased by appropriate DC voltage sources VDC2, VDC3 each having sufficiently high source impedances so as to not interact in an undesired manner with the feedback capacitors C2a, C2b, C3a, C3b.

As indicated in FIG. 1, it is well known that the diodes D1, D2, when implemented in a monolithic IC, have parasitic diodes Dp1, Dp2 associated with them. For example, the first diode D1 has a parasitic diode D1p associated with it, while the second diode D2 has its own parasitic diode D2p associated with it. As is well known, these parasitic diodes Dp1, Dp2 are created by the P-N junction existing between the N-wells of the varactor diode D1, D2 structures and the substrate of the monolithic IC. Accordingly, to minimize undesired effects upon the diodes D1, D2, such as undesired capacitance tuning effects, the diodes D1, D2 are connected such that their cathode terminals are connected to circuit ground GND while their anode terminals are coupled to the inductances L1, L2.

A significant disadvantage to this circuit topology is that the control voltage Vtune which drives the anode terminals of the diodes D1, D2, must be negative (relative to circuit ground GND) so as to avoid forward biasing the diodes D1, D2. In those radio transceiver systems where a single power source, such as a single battery is used for providing the power supply voltage VCC, the requirement of a negative control voltage Vtune (which must be generated by the charge pump 16 in cooperation with the loop filter 14) presents a significant problem. Accordingly, this circuit topology is not practical for many applications.

Figure 2:
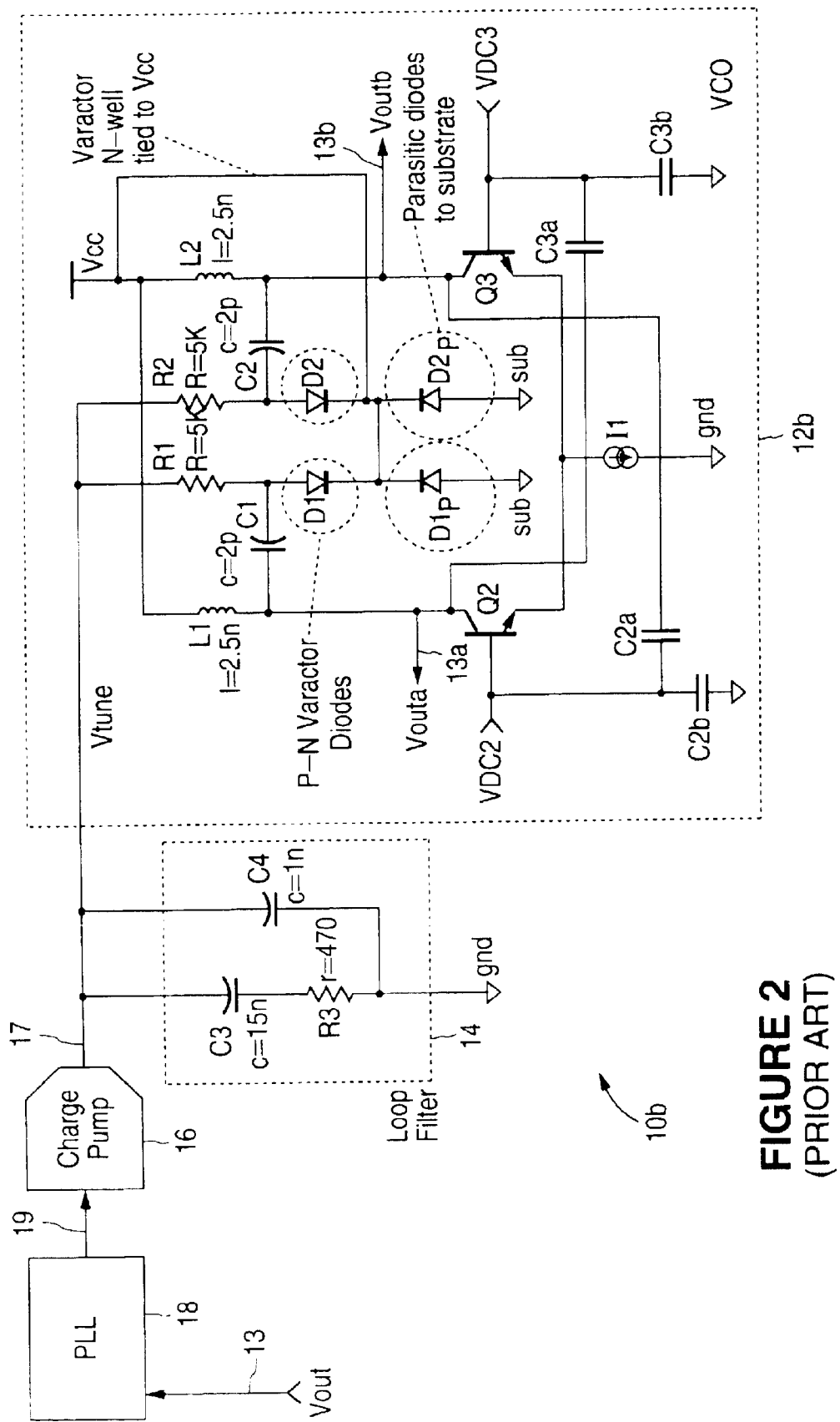
FIG. 2 is a schematic diagram of an alternative embodiment of the circuit of FIG. 1.

Referring to FIG. 2, another conventional frequency synthesizer 10b avoids the need for a negative tuning voltage Vtune by connecting the cathode terminals of the diodes D1, D2 (and, therefore, the cathode terminals of the parasitic diodes D1p, D2p) to the power supply VCC terminal instead of the circuit ground GND terminal. Doing so still maintains the cathode terminals of the diodes D1, D2, D1p, D2p at circuit ground GND for purposes of the radio frequencies (RF). However, the potential for frequency pushing is now significantly increased. Since the frequency of the output signal phases 13a, 13b of the VCO 12b is controlled by the voltage across the diodes D1, D2, with this circuit topology any variation in the power supply voltage VCC becomes a similar voltage variation across the diodes D1, D2, thereby causing a change in the frequency of oscillation due to the change in the resonant frequency caused by a change in capacitance in the diodes D1, D2. In those systems in which the power supply is a single battery, power supply voltage VCC variations are very common due to sudden changes in current drain on the power supply. While a voltage regulator can be used to help stabilize the local power supply voltage VCC for the VCO 12b, more sensitive transceiver systems will often require multiple separate regulators in order to minimize these frequency pushing effects. This complicates the transceiver design, increases power requirements for the power supply and reduces the available power supply voltage VCC for the VCO 12b.

Figure 3:
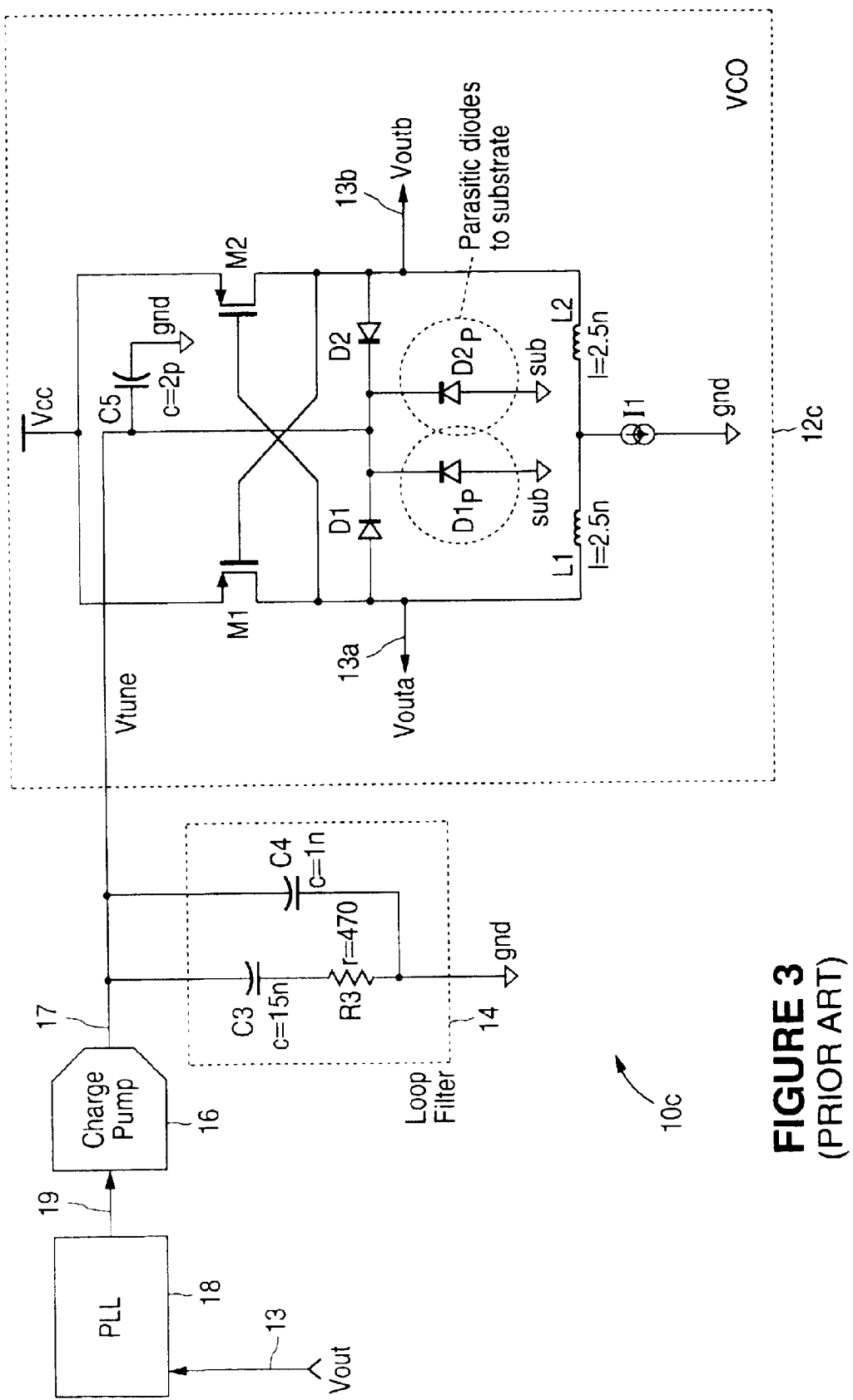
FIG. 3 is a schematic diagram of another alternative embodiment of the circuit of FIG. 1.

Referring to FIG. 3, another conventional frequency synthesizer 10c uses a differential amplifier circuit implemented with metal oxide semiconductor field effect transistors (MOSFETS) instead of bipolar junction transistors (BJTs). The resulting circuit topology allows the use of a positive control voltage Vtune, and has the added advantage over the circuits of FIGS. 1 and 2 in that the diodes D1, D2 can be connected directly to the inductors L1, L2 without the need for RF coupling capacitors C1, C2 (FIGS. 1 and 2). However, this VCO 12c shares the disadvantage of the VCO 12b of the circuit of FIG. 2 with its high sensitivity to variations in the power supply voltage VCC. In this VCO 12c, the voltage VDS across the drain and source terminals of the transistors M1, M2 remains constant for a constant tail current I1. Hence, any variations in the power supply voltage VCC will appear directly across the diodes D1 D2 since the node interconnecting the cathode terminals of the diodes D1, D2, D1p, D2p is at circuit ground GND potential, because of the balanced nature of this circuit 12c and the fact that this node is bypassed to circuit ground GND for purposes of RF signals with a bypass capacitor C5. Therefore, this VCO 12c also has poor frequency pushing performance, thereby making it subject to undesirable frequency variations or noise coupling due to changes in the DC voltage VCC on the power supply line.

Figure 4:
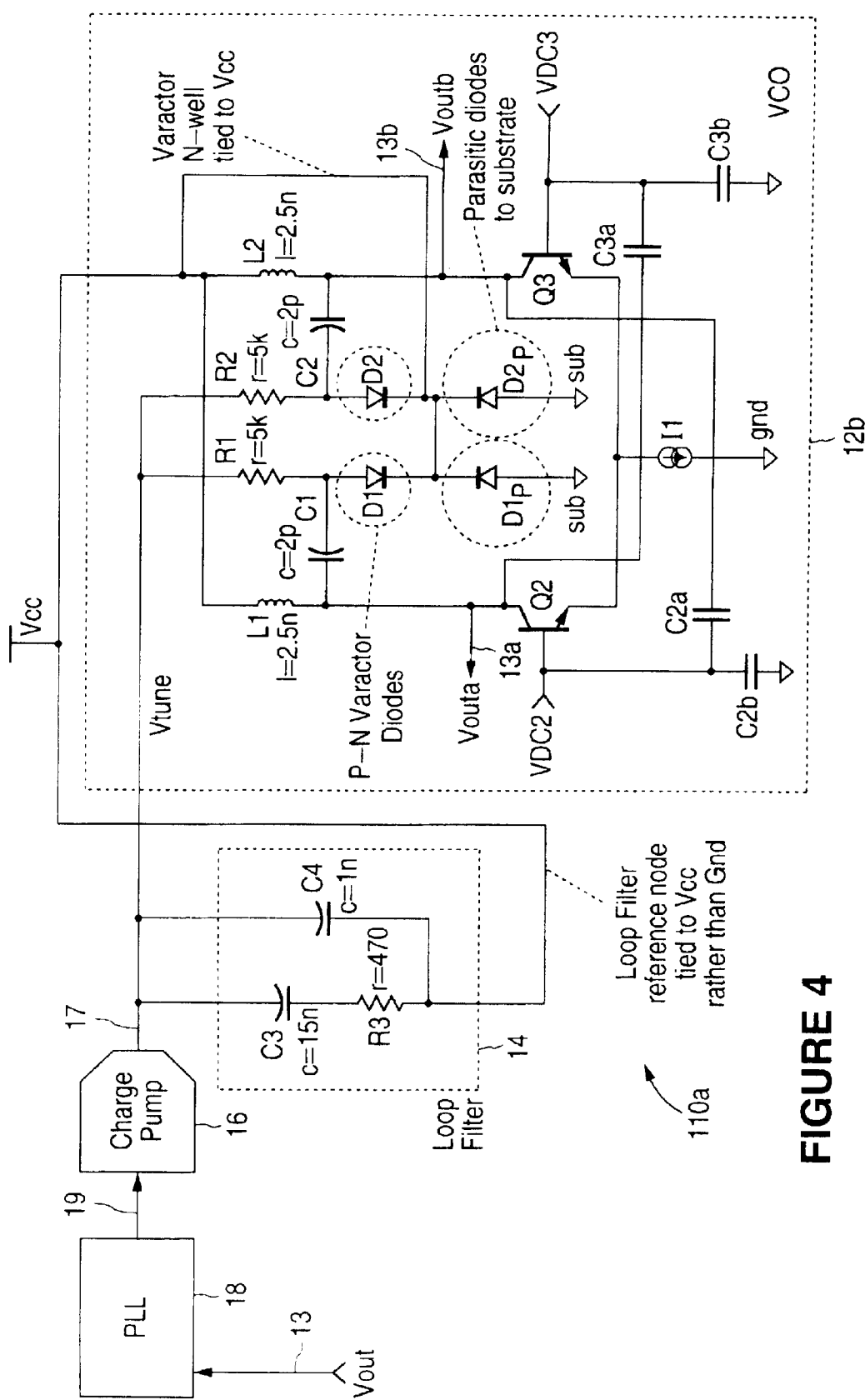
FIG. 4 is a schematic diagram of a frequency synthesizer using a VCO and loop filter circuit with a PLL in accordance with one embodiment of the present invention.

Referring to FIG. 4, a frequency synthesizer 110a, in accordance with one embodiment of the present invention, includes the VCO 12*b* and loop filter 14 discussed above in connection with the circuit 10*b* of FIG. 2, and conventional charge pump 16 and PLL 18 circuitry, interconnected substantially as shown. In this circuit 110*a*, in accordance with the present invention, the problem of frequency pushing is addressed by maintaining the shunt connection of the loop filter 14, but making such shunt connection between the control voltage terminal 17 and the power supply VCC terminal instead of circuit ground GND. As a result, variations in the power supply voltage VCC will appear simultaneously at both the cathode and anode terminals of the diodes D1, D2. While such voltage variations will appear at the cathode terminals simply because they are connected directly to the power supply voltage VCC terminal, such voltage variations will also appear at the anode terminals since they are coupled through the capacitors C3, C4 of the loop filter 14. Hence, the applied tuning voltage across the diodes D1, D2 will remain constant, thereby eliminating first order dependency of the VCO output signal 13 frequency upon the power supply voltage VCC.

This connection of the loop filter 14 between the control voltage terminal 17 and the power supply voltage VCC terminal has no effect upon the operation of the charge pump 16. The charge pump 16 remains capable of sourcing or sinking as much current as is necessary to sufficiently charge or discharge the loop filter capacitors C3, C4 for maintaining the required tuning voltage Vtune at the control voltage terminal 17.

Figure 5:
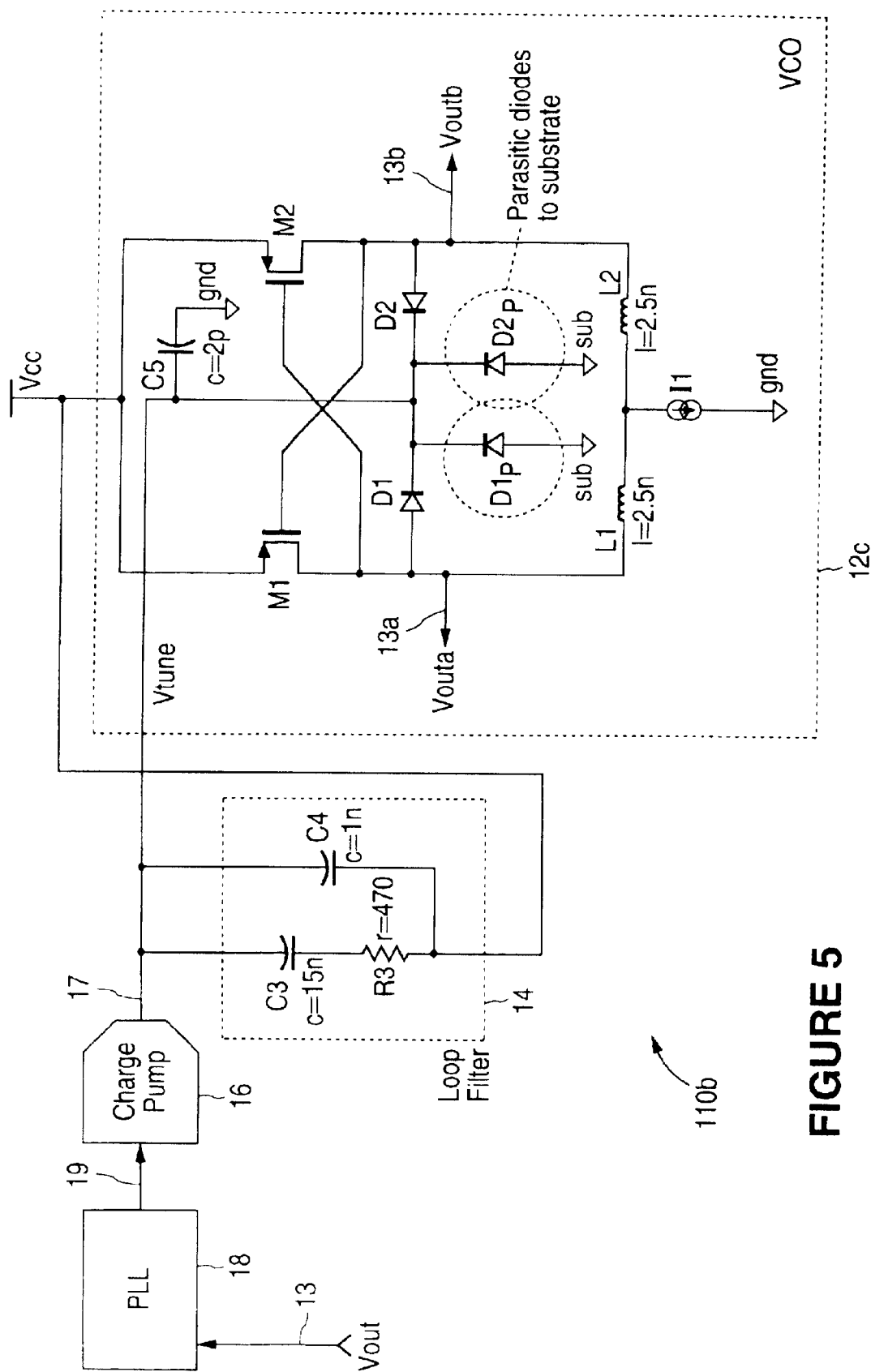
FIG. 5 is a schematic diagram of a frequency synthesizer using a VCO and loop filter circuit with a PLL in accordance with another embodiment of the present invention.

Referring to FIG. 5, in accordance with another embodiment of the present invention, a frequency synthesizer 110*b* includes the VCO 12C and loop filter 14 discussed above in connection with the circuit of FIG. 3, and conventional charge pump 16 and PLL 18 circuitry, interconnected substantially as shown. As in the case of the circuit of FIG. 4, he loop filter 14 connection is maintained in a shunt configuration, but between the control voltage terminal 17 and power supply voltage VCC terminal as shown.

Figure 6:
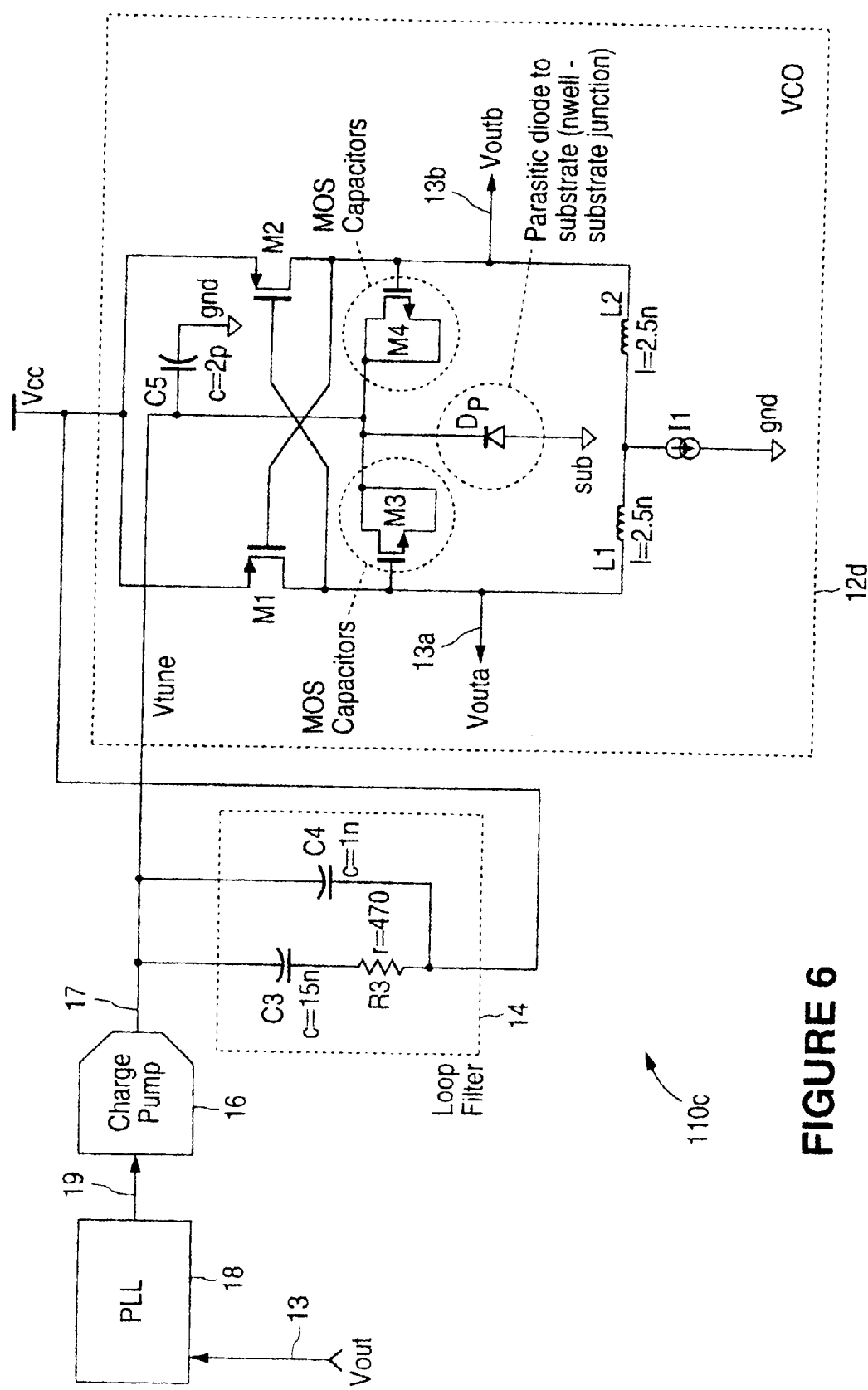
FIG. 6 is a schematic diagram of a frequency synthesizer using a VCO and loop filter circuit with a PLL in accordance with still another embodiment of the present invention.

Referring to FIG. 6, in accordance with still another embodiment of the present invention, a frequency synthesizer 110C can be implemented using a VCO 12*d* in which, instead of diodes, alternative variable capacitance circuitry is used. For example, instead of diodes, insulated gate field effect transistors (IGFETs), such as MOSFETs, can be used in the well known implementation whereby the drain and source terminals are interconnected, thereby creating a variable capacitance by virtue of the gate being insulated from the conductive channel formed between the drain and source terminals. As the voltage varies between the gate terminal and the common drain and source terminals of the transistors M3, M4, so does the capacitance, thereby creating a voltage controlled capacitance similar to that of a diode structure. As in the case of the circuits using diodes, the parasitic diode Dp created by the junction between the substrate and N-well is effectively neutralized by the balanced nature of the circuit and the RF grounding provided by a bypass capacitor C5.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a filter circuit for filtering a control voltage used to control varactor circuitry in a voltage controlled oscillator, comprising:
   a power supply terminal that conveys a power supply voltage having a magnitude and polarity relative to a reference potential;
   a control terminal that conveys a control voltage for varactor circuitry, wherein, relative to said reference potential, said control voltage has a polarity equal to said power supply voltage polarity and a magnitude less than or equal to said power supply voltage magnitude; and
   shunt filter circuitry, connected to and between said power supply and control terminals, that filters said control voltage.

2. An apparatus including, a filter circuit for filtering a control voltage used to control varactor circuitry in a voltage controlled oscillator, comprising:
   a power supply terminal that conveys a power supply voltage having a magnitude and polaritve relative to a reference potential;
   a control terminal that conveys a control voltage for varactor circuitry; wherein, relative to said reference potential, said control voltage has a polarity equal to said poster supply voltage polarity and a magnitude less than or equal to said power supply voltage magnitude; and
   shunt filter circuitry, connected between said power supply and control terminals, that filters said control voltage, wherein said shunt filter circuitry comprises a low pass filter circuit.

3. The apparatus of claim 1, further comprising varactor circuitry, connected between said power supply and control terminals, that in response to said control voltage exhibits a voltage controlled capacitance.

4. The apparatus of claim 3, wherein said varactor circuitry comprises a diode.

5. The apparatus of claim 3, wherein said varactor circuitry comprises an insulated gate field effect transistor.

6. An apparatus including a filter circuit for filtering a control voltage used to control varactor circuitry in a voltage controlled oscillator, comprising:
   a power supply terminal that conveys a power supply voltage having a
   magnitude and polarity relative to a reference potential;
   a control terminal that conveys a control voltage for varactor circuitry, wherein, relative to said reference potential, said control voltage has a polarity equal to said power supply voltage polarity and a magnitude less than or equal to said power supply voltage magnitude;
   shunt filter circuitry, connected between said power supply and control terminals, that filters said control voltage; and
   charge pump circuitry, connected to said control terminal, that in cooperation with said shunt filter circuitry generates said control voltage.

7. The apparatus of claim 1, further comprising:
   a reference terminal that establishes said reference potential; and
   voltage controlled oscillator circuitry, connected between said power supply, reference and control terminals, that in response to said control voltage generates a voltage controlled oscillation signal.

8. An apparatus including a filter circuit for filtering a control voltage used to control varactor circuitry in a voltage controlled oscillator, comprising:
- a power supply terminal that conveys a power supply voltage having a magnitude and polarity relative to a reference potential;
- a control terminal that conveys a control voltage for varactor circuitry, wherein, relative to said reference potential, said control voltage has a polarity equal to said power supply voltage polarity and a magnitude less than or equal to said power supply voltage magnitude;
- shunt filter circuitry, connected to and between said power supply and control terminals, that filters said control voltage;
- a reference terminal that establishes said reference potential; and
- voltage controlled oscillator circuitry, connected between said power supply, reference and control terminals, that in response to said control voltage generates a voltage controlled oscillation signal, wherein said voltage controlled oscillator circuitry comprises
  - bias circuitry, connected between said power supply and reference terminals, that in response to said power supply voltage, generates a bias signal, and
  - resonant circuitry, connected between selected ones of said power supply terminal, reference terminal, control terminal and bias circuitry, that in response to said bias signal and said control voltage generates said voltage controlled oscillation signal.

9. The apparatus of claim 8, wherein said resonant circuitry comprises varactor circuitry, connected between said power supply and control terminals, that in response to said control voltage exhibits a voltage controlled capacitance.

10. The apparatus of claim 9, wherein said varactor circuitry comprises a diode.

11. The apparatus of claim 9, wherein said varactor circuitry comprises an insulated gate field effect transistor.

12. An apparatus including a filter circuit for filtering a control voltage used to control varactor circuitry in a voltage controlled oscillator, comprising:
- a power supply terminal that conveys a power supply voltage having a magnitude and polarity relative to a reference potential;
- a control terminal that conveys a control voltage for varactor circuitry, wherein, relative to said reference potential, said control voltage has a polarity equal to said power supply voltage polarity and a magnitude less than or equal to said power supply voltage magnitude;
- shunt filter circuitry, connected between said power, supply and control terminals, that filters said control voltage;
- a reference terminal that establishes said reference potential;
- voltage controlled oscillator circuitry, connected between said power supply, reference and control terminals, that in response to said control voltage generates a voltage controlled oscillation signal; and
- charge pump circuitry, connected to said control terminal, that in cooperation with said shunt filter circuitry generates said control voltage.

13. An apparatus including a filter circuit for filtering a control voltage used to control varactor circuitry in a voltage controlled oscillator, comprising:
- power supply means for conveying a power supply voltage having a magnitude and polarity relative to a reference potential;
- control means for conveying a control voltage for varactor circuitry, wherein, relative to said reference potential, said control voltage has a polarity equal to said power supply voltage polarity and a magnitude less than or equal to said power supply voltage magnitude; and
- shunt filter means, for filtering said control voltage between said power supply and control terminals.

14. The apparatus of claim 13, further comprising varactor means for responding to said control voltage by exhibiting a voltage controlled capacitance.

15. An apparatus including a filter circuit for filtering a control voltage used to control varactor circuitry in a voltage controlled oscillator, comprising:
- power supply means for conveying a power supply voltage having a magnitude and polarity relative to a reference potential;
- control means for conveying a control voltage for varactor circuitry, wherein, relative to said reference potential, said control voltage has a polarity equal to said power supply voltage polarity and a magnitude less than or equal to said power supply voltage magnitude;
- shunt filter means, for filtering said control voltage between said power supply and control terminals; and
- charge pump means for generating said control voltage in cooperation with said shunt filter means.

16. The apparatus of claim 13, further comprising:
- reference means for establishing said reference potential; and
- voltage controlled oscillator means for responding to said control voltage by generating a voltage controlled oscillation signal.

17. The apparatus of claim 16, wherein said voltage controlled oscillator means comprises varactor means for responding to said control voltage by exhibiting a voltage controlled capacitance.

18. An apparatus including a filter circuit for filtering a control voltage used to control varactor circuitry in a voltage controlled oscillator, comprising:
- power supply means for conveying a power supply voltage having a magnitude and polarity relative to a reference potential;
- control means for conveying a control voltage for varactor circuitry, wherein, relative to said reference potential, said control voltage has a polarity equal to said power supply voltage polarity and a magnitude less than or equal to said power supply voltage magnitude:
- shunt filter means, for filtering said control voltage between said power supply and control terminals;
- reference means for establishing said reference potential;
- voltage controlled oscillator means for responding to said control voltage by generating a voltage controlled oscillation signal; and
- charge pump means for generating said control voltage in cooperation with said shunt filter means.

* * * * *

UNITED STATES PATENT AND TRADEMARK OFFICE
CERTIFICATE OF CORRECTION

PATENT NO. : 6,724,273 B1
DATED : April 20, 2004
INVENTOR(S) : Jones

It is certified that error appears in the above-identified patent and that said Letters Patent is hereby corrected as shown below:

Column 5,
Line 35, please delete "he" and replace with -- the --

Column 6,
Line 22, please delete "polaritive" and replace with -- polarity --
Line 27, please delete "poster" and replace with -- power --

Signed and Sealed this

Twenty-second Day of February, 2005

JON W. DUDAS
*Director of the United States Patent and Trademark Office*